United States Patent
Herbst et al.

(10) Patent No.: US 11,306,375 B2
(45) Date of Patent: Apr. 19, 2022

(54) MOLDED ARTICLE MADE OF A MOLYBDENUM-ALUMINUM-TITANIUM ALLOY

(71) Applicant: Heraeus Deutschland GmbH & Co. KG, Hanau (DE)

(72) Inventors: Stephan Herbst, Aschaffenburg (DE); Bernd Spaniol, Hammersbach (DE)

(73) Assignee: DEUTSCHLAND GMBH & CO. KG, Hanau (DE)

( * ) Notice: Subject to any disclaimer, the term of this patent is extended or adjusted under 35 U.S.C. 154(b) by 0 days.

(21) Appl. No.: 16/796,284

(22) Filed: Feb. 20, 2020

(65) Prior Publication Data
US 2020/0270726 A1 Aug. 27, 2020

(30) Foreign Application Priority Data
Feb. 26, 2019 (EP) .................... 19159429

(51) Int. Cl.
*C22C 27/04* (2006.01)
*C22C 1/02* (2006.01)

(52) U.S. Cl.
CPC .................... *C22C 27/04* (2013.01)

(58) Field of Classification Search
None
See application file for complete search history.

(56) References Cited

U.S. PATENT DOCUMENTS

| | | | |
|---|---|---|---|
| 2,883,283 A * | 4/1959 | Wainer | C22C 27/04 420/429 |
| 5,681,289 A | 10/1997 | Wilcox et al. | |
| 5,693,156 A * | 12/1997 | Berczik | C22C 32/0047 148/407 |
| 2007/0219471 A1 | 9/2007 | Johnson et al. | |
| 2010/0042214 A1 | 2/2010 | Nebosky et al. | |
| 2013/0087094 A1 | 4/2013 | Quinton et al. | |
| 2013/0211369 A1 | 8/2013 | de Beaubien | |
| 2016/0303631 A1 | 10/2016 | Andreaco et al. | |
| 2017/0191188 A1 | 7/2017 | Hochstrasser et al. | |

(Continued)

FOREIGN PATENT DOCUMENTS

| | | |
|---|---|---|
| CN | 107460387 A | 12/2017 |
| CN | 107739891 A | 2/2018 |
| GB | 2290971 A | 1/1996 |

(Continued)

OTHER PUBLICATIONS

Kurt J. Lesker Co., "Molybdenum (Mo) Sputtering Targets", http://web.archive.org/web/20151023132814/https://www.lesker.com/newweb/deposition_materials/depositionmaterials_sputtertargets_1.cfm?pgid=mo1 (Year: 2015).*

(Continued)

*Primary Examiner* — Xiaobei Wang
(74) *Attorney, Agent, or Firm* — Blank Rome LLP

(57) ABSTRACT

The invention relates to a molded article made of a metallic molybdenum-based alloy with at least 3 wt. % up to a maximum of 8 wt. % aluminum, at least 3 wt. % up to a maximum of 6 wt. % titanium and, as the remainder, molybdenum including the usual impurities, wherein the molded article is produced directly or indirectly by means of solidification from a melt. The invention also relates to a method for producing a molded article and to the use of such a molded article.

25 Claims, 1 Drawing Sheet

(56) References Cited

U.S. PATENT DOCUMENTS

2017/0260622 A1* 9/2017 Koestenbauer ..... C23C 14/3414
2018/0028320 A1 2/2018 Forsell

FOREIGN PATENT DOCUMENTS

| JP | S60200980 A | 10/1985 |
|----|----|----|
| JP | H05009642 A | 1/1993 |
| JP | 2012107782 A | 6/2012 |
| JP | 2014012613 A | 1/2014 |
| JP | 2017222537 A | 12/2017 |
| JP | 2018059165 A | 4/2018 |
| WO | WO-2014148157 A1 | 9/2014 |
| WO | WO-2016025968 A1 | 2/2016 |

OTHER PUBLICATIONS

Jörg, et al., Oxidation and Wet Etching Behavior of Sputtered Mo—Ti—Al Films, Journal of Vacuum Science & Technology A: Vacuum, Surfaces, and Films, 2018, 36:2:021513-1-021513-5.
"Molybdenum Material Science and Engineering", edited by Keyuan XU, p. 63, Metallurgical Industry Press, Jul. 2014.
"China Molybdenum Industry", China Nonferrous Metal Industry Association, p. 169, Metallurgical Industry Press, Aug. 2013.
"Chinese Science and Technology Library, General Volume, Mathematics, Physics and Chemistry", edited by Guangya ZHU, et al., p. 1260, Science and Technology Literature Press, Jan. 1998.

* cited by examiner

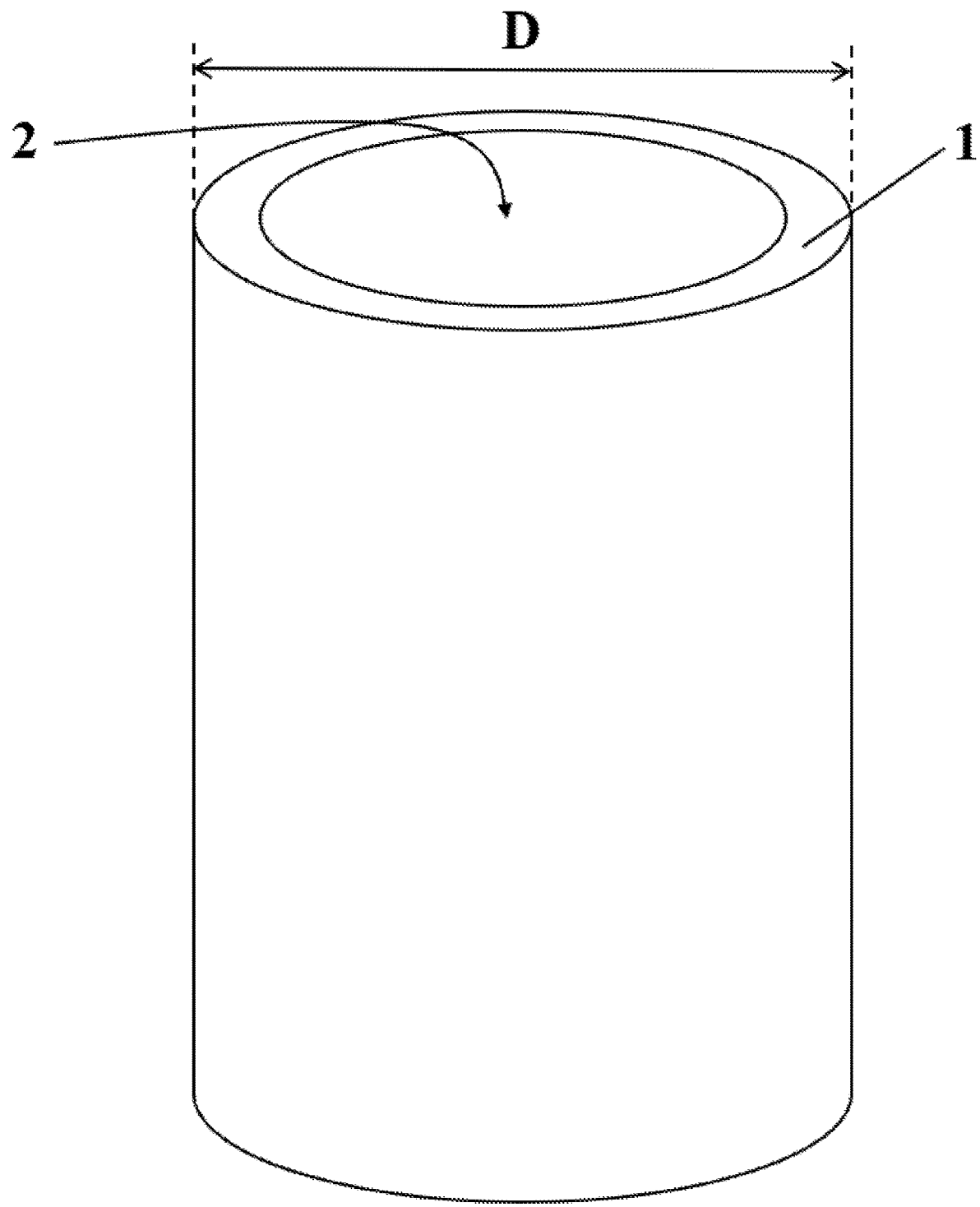

MOLDED ARTICLE MADE OF A MOLYBDENUM-ALUMINUM-TITANIUM ALLOY

CROSS REFERENCE TO RELATED APPLICATION

This application claims the benefit of European Application No. 19159429.0 filed Feb. 26, 2019, the entire contents of which are incorporated by reference herein.

DESCRIPTION

The invention relates to a molded article made of a molybdenum-based alloy. The invention also relates to a method for producing such a molded article and to the use of such a molded article.

Crucibles which completely or mainly consist of iridium are used in the crystal growing of oxides or other chemically aggressive materials from the melt at high temperatures. Such crucibles are known, for example, from US 2016/0303631 A1, JP 2014 012 613 A, US 2013/0087094 A1 and JP 2018 059 165 A. The material iridium has become very expensive. JP 2017 222 537 A proposes that the parts of a molded article made of iridium, which do not come into contact with the chemically aggressive melts, be replaced by less expensive molybdenum. Pure molybdenum crucibles or pure tungsten crucibles can also be used, but they require a complicated plant construction. Such a crucible is known, for example, from US 2017/0191188 A1. One of the disadvantages of molybdenum crucibles is that the crucible material is weakened by evaporating molybdenum oxide by oxidizing molybdenum and atmospheric oxygen and, thus, the durability thereof is restricted. In addition to crucibles, iridium is also popularly used to produce crystal nuclei and other molded articles which come into contact with melts at high temperatures. Heating elements made of iridium are additionally used in order to produce high-temperature furnaces working under atmospheric oxygen. Due to the high price of iridium, it is also necessary to find less expensive possibilities for such applications. In addition, iridium can only be processed with great difficulty, which further increases the production costs of molded articles made of iridium.

A sputtering target made of a molybdenum-based alloy, containing aluminum and titanium, is known from WO 2016/025968 A1. The sputtering target is produced by cold gas spraying a powder mixture onto a suitable support material. The production of a sputtered thin film made of $Mo_{1-x-y}Ti_xAl_y$ is known from the publication "Oxidation and wet etching behavior of sputtered Mo—Ti—Al films" by Tanjy Jörg et al. in the Journal of Vacuum Science & Technology A 36(2), March/April 2018, published by the American Vacuum Society. An account is given therein of a protective $Al_2O_3$ surface layer which is formed as of an aluminum content of at least 16 at %.

This prior art therefore relates to the production of a mixture by means of powder-metallurgical metal mixtures and surface deposits (sputtering). These are then used as a barrier in thin-film transistors and, for this reason, are far from the mixture used on crucibles and other molded articles as bulk materials. Crucibles cannot be produced stably by means of thin-layer technologies. Molded articles cannot therefore be produced economically as bulk materials with the aid of the known thin-film or thick-film technologies.

The object of the invention therefore consists of overcoming the disadvantages of the prior art. In particular, a molded article and a method for producing a molded article are to be provided, which is suitable as a crucible for crystal growing similarly to iridium or which can be used as a bulk material for a high-temperature deployment as a replacement for molded articles made of iridium. The molded article is to be less expensive to produce than comparable molded articles made of iridium. However, at the same time, the molded article is, as far as possible, to be similarly chemically stable or resistant to molded articles made of iridium.

The objects of the invention are achieved by a molded article made of a metallic molybdenum-based alloy with at least 3 wt. % up to a maximum of 8 wt. % aluminum, at least 3 wt. % up to a maximum of 6 wt. % titanium and, as the remainder, molybdenum including the usual impurities, wherein the molded article is produced directly or indirectly by means of solidification from a melt.

The molded article does not have to be produced directly from the melt. The molded article can also be produced as an intermediate product by means of solidification from the melt, said intermediate product subsequently being reshaped in order to produce the final molded article, for example by rolling, drawing or punching, so that the molded article is indirectly produced by means of solidification from the melt. The reshaping is not carried out by melting the intermediate product. Neither are any further alloy constituents added during the reshaping.

The term "the usual impurities" is understood to mean, within the framework of the present invention, the production-related impurities of the elements used, namely molybdenum, aluminum and titanium. These can vary depending on the geographical location of the extraction of the raw materials and depending on the presentation of the elements molybdenum, aluminum and titanium.

The term "molybdenum-based alloy" is understood to be a metallic alloy which contains at least 50 at % molybdenum. The molybdenum-based alloy preferably contains at least 66 at % molybdenum.

The molded article is preferably a heating element or a mold for processing a melt, in particular an oxidic melt.

Provision may be made for the impurities to have in total a proportion of a maximum of 1 at % in the molybdenum-based alloy, preferably a maximum of 0.1 at %.

In this way, it is ensured that the molded article is produced from a largely pure molybdenum-based alloy. As a result, negative effects on the physical properties of the molded article and on the oxidic melts coming into contact with the molded article or other melts or materials can be excluded.

In addition, provision may be made for the impurities to comprise one or more of the elements zirconium, carbon, hafnium, lanthanum, yttrium, cerium, copper, rhenium, niobium, tantalum and tungsten as a main constituent.

These elements are frequently contained as impurities in the pure metals molybdenum, aluminum and titanium and can thus be found again in the molybdenum-based alloy which is alloyed by means of the melt.

Hydrogen and oxygen can additionally be contained as an impurity in the molybdenum alloy, including in proportions of up to 1 at %, however preferably less than 0.1 at %.

A particularly preferred molded article according to the invention can in particular be distinguished in that the molybdenum-based alloy has 5.3 wt. % aluminum±0.5 wt. % aluminum and 4.7 wt. % titanium±0.5 wt. % titanium.

In the case of this composition, the evaporation of molybdenum is particularly low while the molybdenum content is simultaneously high.

Moreover, provision may be made for the molded article to be produced by solidifying a melt in a casting mold.

This means that the molded article is also inexpensive in large volumes and can be produced with, largely, any external shape.

According to a further development of the present invention, provision may be made for the molded article to be a crucible, a rod, a rod having a point for use as a crystal nucleus for crystal growing, a sheet, a plate, a pipe, a heating coil or a heater rod.

These molded articles are particularly well suited to the application with oxidic melts and other melts or as heating elements for furnaces which are operated under atmospheric oxygen.

In addition, provision may preferably be made for the molded article to have a weight of at least 10 g, preferably a weight of at least 100 g.

Molded articles having such a mass can be deployed very well as molds which immediately interact with oxidic melts and other melts, or can be deployed as heating elements for furnaces in atmospheric oxygen. Lower masses could wear away too quickly and become unusable in conjunction with the oxidic melt or another melt or in conjunction with atmospheric oxygen in the furnace chamber.

Provision may also be made for the molded article to comprise a cylindrical outer wall at least in certain areas.

The molybdenum-based alloy can be deployed particularly well for molded articles having a cylindrical outer wall in certain areas on contact with gaseous atmospheric oxygen, oxidic melts or other melts.

Moreover, provision may be made for the molded article to be produced by a mold casting.

As a result, the molded article is particularly inexpensive and can be produced in any form. Finishing can bring the molded article into a more exact form or into a form which is more difficult to achieve by mold casting.

In addition, provision may preferably be made for the molded article to contain at least 85 wt. % molybdenum.

The high molybdenum content is significant for the temperature stability.

Provision may also be made for the molded article to contain at least 4 wt. % aluminum, preferably at least 4.5 wt. % aluminum.

Due to this aluminum content, the evaporation of molybdenum is particularly low while the molybdenum content is simultaneously high.

In addition, provision may be made for the molded article to contain at least 4 wt. % titanium.

Due to this titanium content, the evaporation of molybdenum is particularly low while the molybdenum content is simultaneously high.

The objects which form the basis of the present invention are also achieved by a method for producing a molded article from a molybdenum-based alloy with 3 wt. % to 8 wt. % aluminum, 3 wt. % to 6 wt. % titanium and, as the remainder, molybdenum including the usual impurities, characterized by the following chronologically successive steps:

A) producing a melt consisting of 3 wt. % to 8 wt. % aluminum, of 3 wt. % to 6 wt. % titanium and, as the remainder, molybdenum including the usual impurities;

B) pouring the melt into a casting mold and solidifying the melt in the casting mold; and C) releasing the molded article thus obtained from the casting mold.

Provision may be made for a molded article according to the invention to be produced with the method.

In addition, provision may be made for the melt to be melted from the pure metals molybdenum, aluminum and titanium including the usual impurities thereof in step A), wherein the usual impurities are preferably present with a proportion of less than 1 at %, particularly preferably with a proportion of less than 0.1 at %.

In this way, it is ensured that the molded article is produced from a largely pure molybdenum-based alloy. As a result, negative effects on the physical properties of the molded article and on the melts and materials coming into contact with the molded article can be excluded.

Moreover, provision may be made for a step D) to be carried out following step C), during which step D) the molded article is reshaped, preferably by deburring, cutting, rolling, drawing, polishing and/or milling.

As a result, the molded article can be brought into a desired form which is not available or is only available with difficulty directly by fusion casting.

The objects which form the basis of the present invention are also achieved by using a molded article according to the invention or a molded article produced with a method according to the invention as an iridium replacement material.

This intended purpose is particularly sensible for the molded article made of the molybdenum-based alloy, since it is less expensive than a molded article made of iridium but can be deployed similarly.

The invention is based on the surprising realization that it is possible to replace appropriate but costly molded articles made of iridium with a molded article made of a molybdenum-based alloy according to the invention, wherein the molded article has a lower loss of molybdenum due to evaporation of molybdenum than a molded article made of pure molybdenum.

This is achieved in that the problem of molybdenum evaporating from the surface of the molded article can be counteracted with the alloy used. It has surprisingly been discovered that the evaporation of molybdenum on the surface of the molded article made of a molybdenum-based alloy can be prevented by an aluminum oxide layer and/or, if applicable, other effects, which evaporation already stops at relatively low aluminum concentrations in the molybdenum-based alloy. Compared with the same molded article made of pure molybdenum, the molded article according to the invention therefore has a higher service life and causes fewer impurities due to evaporating molybdenum, wherein the chemical stability of the molded article simultaneously corresponds to that of a molded article made of pure molybdenum. As a result, the molded article according to the invention is better suited to many applications as a replacement for molded articles made of iridium than molded articles made of pure molybdenum or made of other molybdenum-based alloys known for this purpose.

According to the present invention, the molybdenum-based alloy is produced by means of a melt. As an application, a crucible can be used, for example, as a molded article for high-temperature applications such as crystal growing for sensors, laser crystals or semiconductors for diodes.

Exemplary embodiments of the invention are explained below with reference to a schematically depicted FIGURE, but without thereby restricting the invention.

FIG. 1 shows a schematic perspective depiction of a molded article according to the invention.

The molded article according to the exemplary embodiment in accordance with FIG. 1 is a crucible having a cylindrical outer circumference and can comprise a rotationally symmetrical form to the cylinder axis of the outer circumference. The crucible can be laterally delimited by walls 1 which can comprise a uniform thickness. The crucible can be open upwardly and comprise an opening 2 there (see FIG. 1 at the top). One end of the crucible which is opposite the opening 2 shown (at the top in FIG. 1) can be sealed with a flat, planar base plate (not visible). As a result, an interior chamber for receiving a melt can be configured in the interior of the crucible, which can be delimited laterally by the walls 1 and on the underside by the base plate.

The crucible preferably consists of 5 to 6 wt. % aluminum, 4 to 5 wt. % titanium and the remainder of molybdenum as well as the usual impurities or another molybdenum-based alloy with 3 wt. % to 8 wt. % aluminum and 3 wt. % to 6 wt. % titanium as well as the usual impurities.

The crucible can be produced from a melt by mold casting. In order to produce the melt, the metals aluminum, titanium and molybdenum can be fused and alloyed in the desired composition by inert gas pressure melting in an arc melting furnace. During this, a pressure electroslag remelting method can be applied without slag. The melt can solidify in the gravity casting die during withdrawal downwardly from the liquid, in order to form the crucible. The crucible can be produced by primary or secondary reshaping from the resulting block or can be worked by machining from the solid material.

Instead of a crucible, as shown in FIG. 1, other molded articles such as rods, heating coils and pipes can also be produced with the same method. Such molded articles can also be reshaped further following solidification from the melt. Suitable methods for this are known to and familiar to the person skilled in the art.

The features of the invention disclosed in the above description, as well as in the claims, FIGURES and exemplary embodiments, may be essential both individually and in any desired combination to the realization of the invention in its various embodiments.

LIST OF REFERENCE NUMERALS

1 Crucible wall
2 Opening
D Diameter of the crucible

The invention claimed is:

1. A molded article consisting of a metallic molybdenum-based alloy, the metallic molybdenum-based alloy consisting of at least 4 wt. % up to a maximum of 8 wt. % aluminum, at least 3 wt. % up to a maximum of 6 wt. % titanium and, as the remainder, molybdenum and impurities associated therewith, wherein the molded article is produced by solidifying a melt in a casting mold.

2. The molded article of claim 1, wherein the impurities are a maximum of 1 at % of the molybdenum-based alloy.

3. The molded article of claim 1, wherein the impurities comprise one or more of the elements zirconium, carbon, hafnium, lanthanum, yttrium, cerium, copper, rhenium, niobium, tantalum and tungsten.

4. The molded article of claim 1, wherein the molybdenum-based alloy has 5.3±0.5 wt. % aluminum and 4.7±0.5 wt. % titanium.

5. The molded article of claim 1, wherein the molded article is a crucible, a rod, a rod having a point for use as a crystal nucleus for crystal growing, a sheet, a plate, a pipe, a heating coil or a heater rod.

6. The molded article of claim 1, wherein the molded article has a cylindrical outer wall at least in certain areas.

7. The molded article of claim 1, wherein the molded article contains 86 to 92 wt. % molybdenum.

8. The molded article of claim 1, wherein the molded article contains 4 to 6 wt. % aluminum.

9. The molded article of claim 1, wherein the molded article contains at least 4 wt. % up to a maximum of 6 wt. % titanium.

10. A method for producing a molded article from a molybdenum-based alloy consisting of 4 wt. % to 8 wt. % aluminum, 3 wt. % to 6 wt. % titanium and, as the remainder, molybdenum and impurities associated therewith, the method comprising the following chronologically successive steps:
   A) producing a melt consisting of 4 wt. % to 8 wt. % aluminum, 3 wt. % to 6 wt. % titanium and, as the remainder, molybdenum and impurities associated therewith,
   B) pouring the melt into a casting mold and solidifying the melt in the casting mold to form a molded article in the casting mold, and
   C) releasing the molded article thus obtained from the casting mold.

11. The method of claim 10, wherein the molded article obtained from the casting mold contains 86 to 92 wt. % molybdenum.

12. The method of claim 10, wherein, in step A), the melt is melted from pure metals of molybdenum, aluminum and titanium, and the impurities associated therewith, wherein the impurities are present in an amount of less than 1 at %.

13. The method of claim 10, further comprising:
   D) reshaping the molded article,
   wherein step D) is performed after step C).

14. The molded article of claim 1, the molded article capable of replacing an iridium material.

15. A molded article formed by the method of claim 10, the molded article capable of replacing an iridium material.

16. The method of claim 13, wherein reshaping comprises one or more of deburring, cutting, rolling, drawing, polishing and milling.

17. The molded article of claim 1, wherein the melt consists of aluminum, titanium, molybdenum and the associated impurities.

18. A molded article consisting of a metallic molybdenum-based alloy, the metallic molybdenum-based alloy consisting of at least 4 wt. % up to a maximum of 8 wt. % aluminum, at least 3 wt. % up to a maximum of 6 wt. % titanium and, as the remainder, molybdenum and impurities associated therewith, wherein
   the molded article is a crucible, a rod, a rod having a point for use as a crystal nucleus for crystal growing, a sheet, a plate, a pipe, a heating coil or a heater rod; and
   the molded article is produced directly or indirectly by means of solidification from a melt.

19. The molded article of claim 18, wherein the impurities are a maximum of 1 at % of the molybdenum-based alloy.

20. The molded article of claim 18, wherein the impurities comprise one or more of the elements zirconium, carbon, hafnium, lanthanum, yttrium, cerium, copper, rhenium, niobium, tantalum and tungsten.

21. The molded article of claim 18, wherein the molybdenum-based alloy has 5.3±0.5 wt. % aluminum and 4.7±0.5 wt. % titanium.

22. The molded article of claim 18, wherein the molded article is produced by a mold casting.

23. The molded article of claim 18, wherein the molded article contains 86 to 92 wt. % molybdenum.

24. The molded article of claim 18, wherein the molded article contains 4 to 6 wt. % aluminum.

25. The molded article of claim 18, wherein the molded article contains at least 4 wt. % up to a maximum of 6 wt % titanium.

\* \* \* \* \*